US006255832B1

United States Patent
Notohardjono et al.

(10) Patent No.: US 6,255,832 B1
(45) Date of Patent: Jul. 3, 2001

(54) FLEXIBLE WAFER LEVEL PROBE

(75) Inventors: Budy Darmono Notohardjono; Roger Ray Schmidt; Prabjit Singh, all of Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/454,131

(22) Filed: Dec. 3, 1999

(51) Int. Cl.⁷ .................................................. G01R 31/02
(52) U.S. Cl. ............................................................ 324/754
(58) Field of Search ..................................... 324/537, 538, 324/754, 757, 758, 761, 762

(56) References Cited

U.S. PATENT DOCUMENTS

| | | | |
|---|---|---|---|
| 4,423,376 | * 12/1983 | Byrnes et al. | 324/158 P |
| 4,686,464 | 8/1987 | Elsa Sser et al. | 324/158 |
| 4,774,462 | 9/1988 | Black | 324/158 |
| 4,799,007 | 1/1989 | Cook et al. | 324/158 |
| 4,801,876 | 1/1989 | Nanazi | 324/158 |
| 5,210,485 | 5/1993 | Kreiger et al. | 324/158 |
| 5,225,777 | * 7/1993 | Bross et al. | 324/158 P |
| 5,394,099 | * 2/1995 | Kazama | 324/754 |
| 5,450,017 | 9/1995 | Swart | 324/754 |
| 5,500,606 | 3/1996 | Holmes | 324/761 |
| 5,773,988 | 6/1998 | Sayre et al. | 324/761 |
| 6,087,840 | * 7/2000 | Mizuta | 324/754 |

FOREIGN PATENT DOCUMENTS 0 840 131 A2    5/1998 (DE) .............................. G01R/1/073

* cited by examiner

*Primary Examiner*—Safet Metjahic
*Assistant Examiner*—E P LeRoux
(74) *Attorney, Agent, or Firm*—Floyd A. Gonzalez; James E. Murray

(57) ABSTRACT

A test probe head has a plurality of electrically conducting wire members held in place in a frame by movable plates. The wire members are threaded through apertures in the plates and the plates are moved relative to each other to bend the wires to thereby hold the wires in position in the frame. The wires are used to make physical contact with both a support substrate for the test probe head and an integrated circuit under test. The physical contact of the wires with both the substrate and the integrated circuit provides electrical connections between the pads in the support substrate and those on the integrated circuit to perform the testing of the integrated circuit. With this arrangement, there is no bonding of the wires to the pads of the support substrate. The elimination of the bonding to the pads of the support substrate eliminates a major cause of probe head failures. Further since the movable wafers hold the wires in operating position, there is no need of embedding the wires in a potting compound permitting removal and replacement of individual wires by manipulation of the movable wafers.

15 Claims, 4 Drawing Sheets

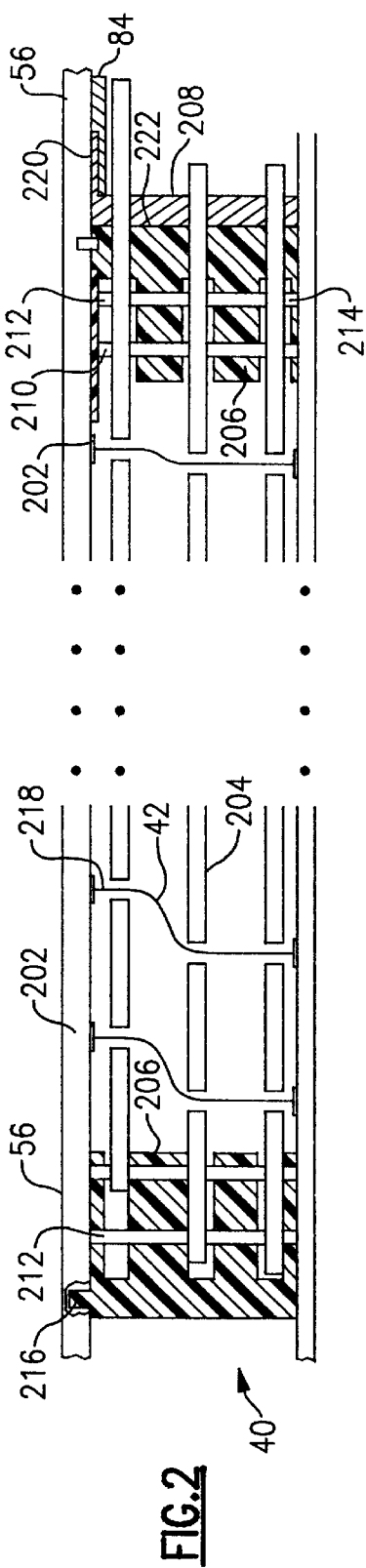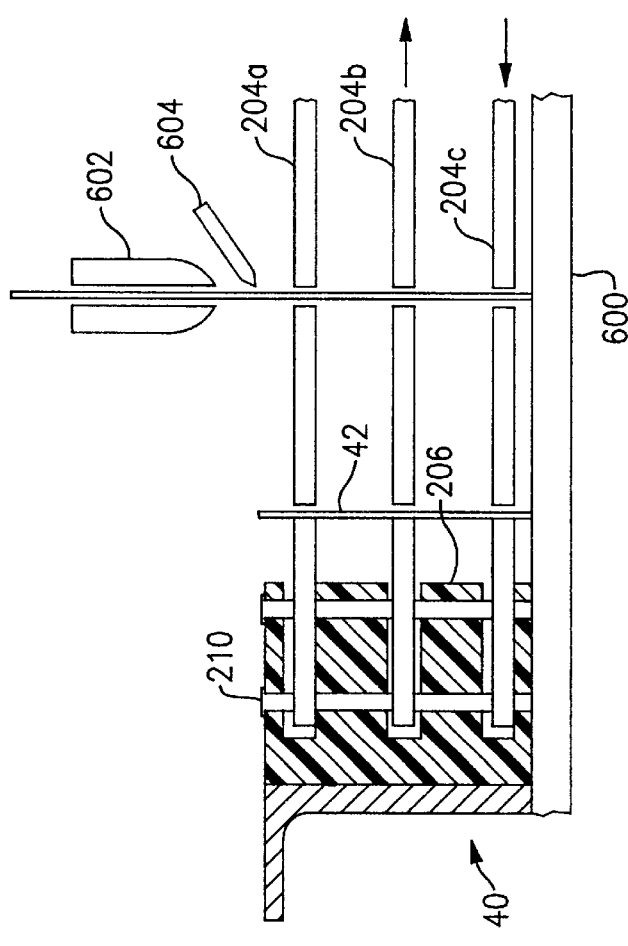

FLEXIBLE WAFER LEVEL PROBE

FIELD OF THE INVENTION

This invention relates to a test probe for integrated circuit devices and more particularly, to the test probe's structure and its method of fabrication and use.

BACKGROUND OF THE INVENTION

Integrated circuits (IC) chips are tested before they are packaged in an electronic product, such as a computer. Testing is essential to determine whether the integrated circuit's electrical characteristics conform to the specifications to which it was designed to ensure that electronic product performs the function for which it was designed.

Testing is an expensive part of the fabrication process for a contemporary computing systems. The functionality of every I/O of a contemporary integrated circuit must be tested since a failure to achieve the design specification at even a single I/O can render an integrated circuit unusable for a specific application. Testing is commonly done both at room temperature and at elevated temperatures to test functionality and at elevated temperatures with forced voltages and currents to burn the chips in and to test the reliability of the integrated circuit and to screen out early failures.

Contemporary probes for integrated circuit testing are expensive to fabricate and are easily damaged. In Beaman et al. U.S. Pat. No. 5,635,846, entitled "Test Probe Having Elongated Conductor Embedded in an Elastomeric Material Which is Mounted on a Space Transformer" (which patent is hereby incorporated by reference), a contemporary test probe head is fabricated of a group of elongated metal wire conductors that are attached to a support substrate and then embedded in a potting compound. The wire conductors can be easily damaged with large displacements. In a typical failure, a wire at the probe head breaks off from the substrate at the point of attachment to a pad on the support substrate. Generally, upon such a failure, the entire probe head has to be replaced. Because of the large number of wire conductors in the test probe head, such breakage is not uncommon so that probe head replacement adds substantial expense to the testing of integrated circuits.

Therefore, it is an object of the present invention to provide an improved high density test probe and method of fabrication.

It is another object of the present invention to provide an improved test probe for testing and burning-in of integrated circuits.

It is another object of the present invention to provide an improved test probe and apparatus for testing integrated circuits in wafer form.

It is an additional object of the present invention to provide probes having contacts capable of large displacements which can be used for high performance, functional testing and for high temperature bum-in applications.

It is yet another object of the present invention to provide probe heads that can be reworked several times by replacing individual wires used in the probe.

SUMMARY OF TIE INVENTION

In accordance with the present invention, a test probe head has a plurality of electrically conducting wire members held in place in a frame by movable plates. The wire members are threaded through aligned apertures in the plates and the plates are then moved relative to each other misaligning the apertures to bend the wires thereby holding the wires in position in the frame. The wires are used to make physical contact with both a support substrate for the test probe head and an integrated circuit under test. The physical contact of the wires with both the substrate and the integrated circuit provides electrical connections between the pads in the support substrate and those on the integrated circuit to perform the testing of the integrated circuit. With this arrangement, there is no bonding of the wires to the pads of the support substrate. The elimination of the bonding to the pads of the support substrate eliminates a major cause of probe head failures by avoiding high concentration of stress at the bend area. Further, since the movable plates hold the wires in operating position, there is no need of embedding the wires in a potting compound permitting removal and replacement of individual wires by manipulation of the movable wafers

BRIEF DESCRIPTION OF THE DRAWINGS

FIG. 2 is a sectional view of the probe head in accordance with the present invention.

FIGS. 6 to 8 are sectional views of the probe head of the present invention illustrating its fabrication.

DETAILED DESCRIPTION

Figure 1:
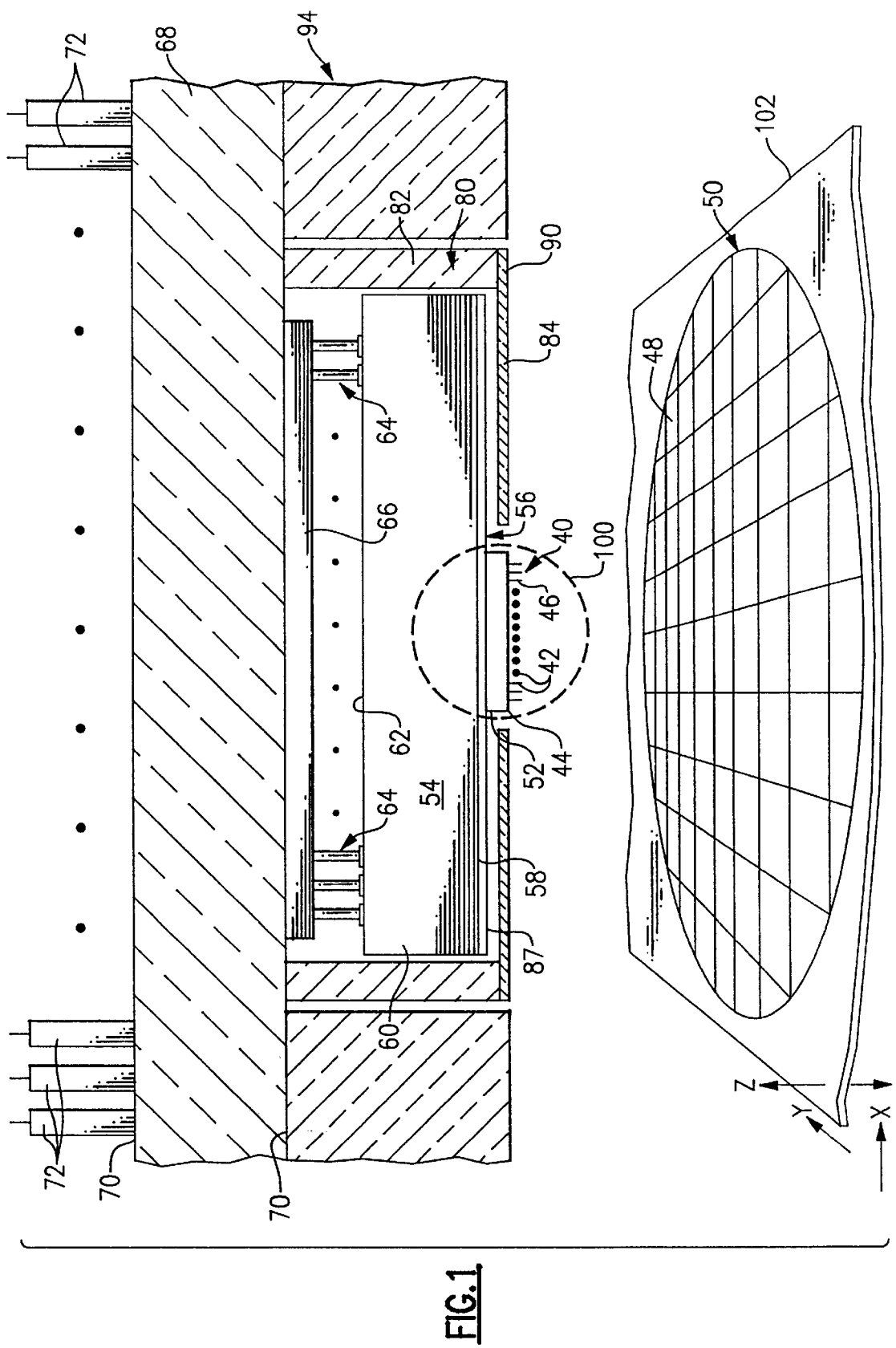
FIG. 1 is a schematic diagram of one embodiment of a tester using a probe structure of the present invention.

Referring now to FIG. 1, probe head 40 is formed from a plurality of elongated electrically conducting members 42. The elongated conducting members 42 have ends 46 for probing contact locations on integrated circuit devices 48 of wafer 50. The opposite ends of the elongated electrical conductors 42 are in electrical contact with space transformer 54. The space transformer 54 contains a metal/ceramic substrate, a multilevel metal/polymer substrate or a printed circuit board typically used as packaging substrates for integrated circuit chips. Space transformer 54 has a surface layer 56 comprising a plurality of layers of thin dielectric films, preferably polymer films such as polyimide, and a plurality of layers of electrical conductors, for example, copper conductors. A process for fabricating multilayer structure 56 for disposing it on surface 58 of substrate 60 to form a space transformer 54 is described in U.S. Pat. No. 5,258,233, filed on May 3, 1991, entitled "Multi-Layer Thin Film Structure and Parallel Processing Method for Fabricating Same", which patent is assigned to the assignee of the present invention, and the teaching of which is incorporated herein by reference.

As shown in FIG. 1, on surface 62 of substrate 60, there are, a plurality of pins 64. Surface 62 is opposite the surface 87 on which probe head 40 is disposed. Pins 64 are standard pins used on integrated circuit chip packaging substrates. Pins 64 are inserted into socket 66 or plated through-holes in the substrate 68 which is disposed on surface 70 of second space transformer 68. Socket 66 is a type of pin grid array (PGA) socket such as commonly disposed on a printed circuit board of an electronic computer for receiving pins from a packaging substrate. Second space transformer 68 can be any second level integrated circuit packaging substrate, for example, a standard printed circuit board.

Socket 66 is disposed on surface 70 of substrate 68. On opposite surface 70 of substrate 68 there are disposed a plurality of electrical connectors to which coaxial cables 72 are electrically connected. Alternatively, socket 68 can be a zero insertion force (ZIF) connector or the socket 68 can be replaced by through-holes in the substrate 68 wherein the through-holes have electrically conductive material surrounding the side walls such as a plated through-hole.

Figure 3:
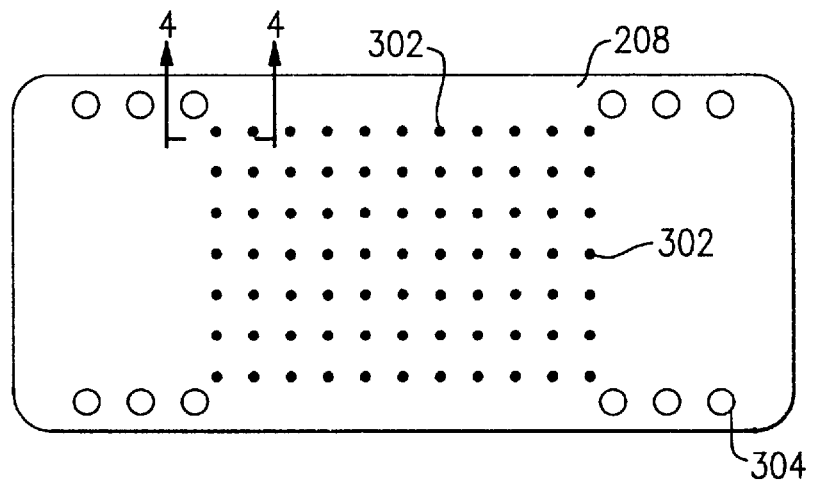
FIG. 3 is a schematic diagram of a restraining plate of the probe structure of the present invention.

As shown in FIG. 3 of U.S. Pat. No. 5,635,846 filed on Apr. 30, 1993 and entitled "Test Probe Having Elongated Conductor Embedded in an Elastomeric Material Which is Mounted on a Space Transformer", the teaching of which patent is hereby incorporated by reference, the pin 64 and socket 66 combination of the embodiment of FIG. 1 is replaced by an interposer of elastomeric material 76. The structure of elastomeric connector and the process for fabricating elastomeric connector is described in copending U.S. Pat. No. 5,731,654 to B. Beaman et al., filed Oct. 19, 1992, and entitled "Three Dimensional High Performance Interconnection Means", the teaching of which patent is incorporated herein by reference.

Space transformer 54 is held in place with respect to second space transformer 68 by gripping means or by clamping arrangement 80 which is comprised of member 82 which is perpendicularly disposed with respect to surface 70 of second space transformer 68 and member 84 which is preferably parallely disposed with respect to surface 86 of first space transformer 54. Member 84 presses against surface 87 of space transformer 54 to hold space transformer 54 in place with respect surface 70 of space transformer 64. Member 82 of clamping arrangement 80 can be held in place with respect to surface 70 by a screw which is inserted through member 84 at location 90 extending through the center of member 82 and screw into surface 70.

The entire assembly of second space transformer 68 and first space transformer with probe head 40 is held in place with respect wafer 50 by assembly holder 94 which is part of an integrated circuit test tool or apparatus having a platform 102 for disposing the probe tip ends 46 in contact with content locations on the integrated circuit being tested. Members 82, 84 and 90 can be made from materials such as aluminum.

FIG. 2 is an enlarged sectional view of the region of FIG. 1 within dashed circle 100 which view shows the configuration of probe head 40 and its attachment to substrate 60 of space transformer 54. As shown, the elongated conductors or wires 42 are bent and held in place against lands 202 on the substrate 56 of a metal casing 208. The wires 42 are held in their bent configuration by perforated plates 204 which in turn are held in place to a slotted frame 206 of a plastic such as polycarbonate. The upper and lower walls of the slots 212 restrict vertical movement of the plates 204 while pins 210 and 214 thru the plate 204 and the frame 206 restrict the plate's horizontal motion. Registration pins 216 hold the ends 218 of the wires 42 in registration with the contact pads 202 on the ceramic substrate.

Figure 4:
FIG. 4 is a section taken along line 4—4 of FIG. 3.

The metal casing 208 surrounding the frame 206 has a flange 220 that is clamped to the ceramic substrate by plate 84 when the probe head is in its operational configuration and also has slots 222 at one end thereof through which the plates 204 protrude. The perforated plates 208, as best be seen in FIGS. 3 and 4, have a metal alloy core 403 of Invar or other metal alloy that expands and contracts at the same rate as glass to compensate for changes in the size of the wafer work piece with temperature. To prevent shorting of the wires to one another; the plates 208 are given a polyimid coating 404. The plates have a matrix of holes 302 for passage of the wires therethrough and a sequence of peripheral holes 304 for assembling the plates and wires using the dowel pins 212 and 214. The plates with the coating are each about 3 mils thick.

Figure 5:
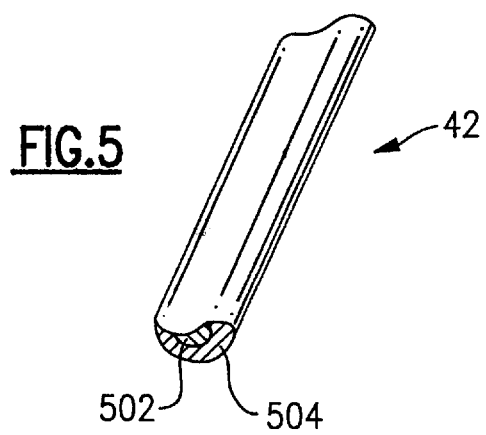
FIG. 5 is an elongated wire probe used in the present invention.

As shown in FIG. 5, the elongated probes 42 are of a bimetalic wire with a core 502 of one metal and a coating 504 of a different metal. The coating is a metal or alloy with a tensile strength of 100 ksi or greater, and the core contains a harder metal or alloy with a tensile strength of 100 ksi or greater. The wire is approximately 0.0015 to 0.003 inches in diameter, and the holes 302 in the plates slightly larger to accommodate insertion in the wire while at the same time being small enough to restrict movement of the wires by the side walls to the hole.

As shown in FIG. 2, in assembling, the probe head 40, the plates 204 are slid through the slots 222 in the casing 208 into the slots 212 in the frame 206. Referring to FIG. 6, the probe head 40 is then placed on a fixture 600 with the dowel pins 210 holding the plates in an initial registration position so that the apertures in the plates 204 are aligned vertically with one another. A placement head 602 positions wire over each set of vertically aligned holes 30 and the wire is threaded into the holes until it contacts the fixture 600. The wires 42 are then cut to length by the cutting tool 604. Notice that the cut wires are substantially longer than the height of the frame. This is to enable the length of the wires when bent to exceed the height of the frame and contact both the circuit board and the test object of FIG. 2.

Figure 7:
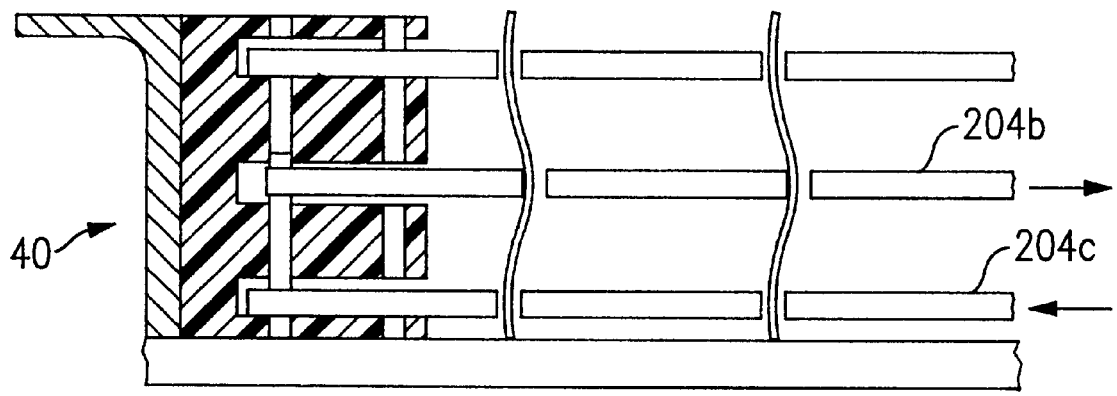
Figure 8:
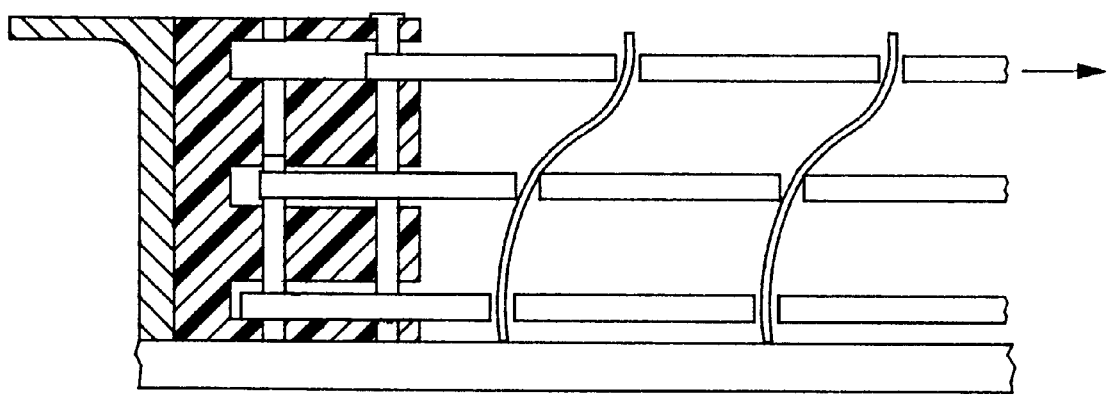

As shown in FIG. 7, when all the pins are inserted the registration pin is removed and the two lower plates are then slid horizontally to bend the center of the pins with the sidewalls of the holes 302 of plate 204b while the sidewalls of the plate holds the tips 46 of the wires vertical. When the pins are in this position, the set of short registration pins 214 are is inserted through the frame into the two plates and the lower portion of the frame. With the short pins 214 in place, the upper plate is moved bending the pins into the position shown in FIG. 8 and a longer pin is reinserted through the frame. With all pins in place, the probe head is removed from the fixture and clamed onto the tester of FIG. 1, as previously discussed.

If a wire 42 breaks or is otherwise defective, the probe head is unclamped from the tester and placed back on the fixture 600. With the probe head in the fixture the registration pins are removed from the frame, the plates slide back into the initial registration position shown in FIG. 6. The placement tool 602 is then used to remove the broken wire. A replacement wire is then inserted in the place of the broken pin by the placement tool and the described process of assembling the probe head is repeated.

Above we have described one embodiment of the invention. A number of modifications and additions may be made in this embodiment. Therefore, it is understood that the present invention is not limited to the structure of the disclosed embodiment but encompasses the spirit and scope of the appended claims.

We claim:

1. A probe for making a plurality of electric connections to an electronic device comprising:

a plurality apertured plates slidable within the frame between a first relative position with the apertures in different plates aligned and a second relative position where the apertures in different plates are skewed relative to one another;

elongated probes passing through the apertures in the plates and held fixed in a bent operational position with the plates in their second relative position by misalignment of the apertures relative to one another, said elongated probes having tips at both ends, at one end thereof for making electrical contact to the electronic device and at the other end to be held in contact to a test board to allow electrical signals to pass between the device and the board.

2. The probe of claim 1, wherein said frame is slotted with the plates movable in the slots to bend the elongated probes into their operating position.

3. The probe of claim 2, wherein each of said plates have a plurality of registration holes therein each associated with one of the relative positions.

4. The probe of claim 3, including:

registration pins through said plates and said frame, said registration pins being inserted through one or another of the holes in the plates to hold the elongated probes fixed in their bent operational position or in a position where the elongated probes can be removed or inserted from the apertures to enable their insertion and replacement.

5. The probe of claim 4 including an interposer containing the test board and an attachment mechanism holding the test board to the elongated probes for electrical connection without adhering the elongated probes to electrical contacts in the test board.

6. The probe of claim 3, wherein the elongated probes are bimetalic with an exterior shell and a harder metallic core so that they flex in response to movement of the plates.

7. The probe of claim 6, wherein the exterior shell contains a high tensile strength metal or alloy and the harder high tensile strength metal or allow metallic core.

8. The probe of claim 1, wherein the deflection of the elongated probes is greater than 0.005 inches.

9. A method of fabricating a probe for making electronic connections to an electronic device, a method comprising:

a) providing elongated wires for making electrical connections between the test board and the electronic device;

b) inserting each of the wires through a plurality of aligned apertures in different plates;

c) sliding the plates with respect to one another so that the wires are held in place by the pressure exerted on them by the sides walls of the misaligned apertures in the plates; and d) holding the plates together so that the wires are retained in their bent positions.

10. The method of claim 9, including the steps of:

e) sliding the plates to realign the apertures;

f) removing a faulty pin from the probe and replacing it with a new pin; and g) repeating steps c) and d).

11. The probe of claim 1, wherein the spacing of the elongated probes is substantially the same at both ends thereof and at points in which they pass through the plates.

12. The probe of claim 11, wherein the elongated probes are substantially straight with the plates in their first relative position.

13. The probe of claim 1 including a third relative position for the aperture plates.

14. The probe of claim 13 including at least three apertured plates positions are changed to move the plates into their three relative positions between insertion of the elongated probes and their bent operational position.

15. The method of claim 9 including providing the elongated wires in substantially straight form from a stock wire source and cutting the wires to length after insertion through the elongated plates.

* * * * *

UNITED STATES PATENT AND TRADEMARK OFFICE
CERTIFICATE OF CORRECTION

PATENT NO.  : 6,255,832 B1  
DATED  : July 3, 2001  
INVENTOR(S)  : Notohardjono et al.

Page 1 of 1

It is certified that error appears in the above-identified patent and that said Letters Patent is hereby corrected as shown below:

Column 1,  
Line 61, "TIE" should be -- THE --;

Column 4,  
Line 41, "claimed" should be -- clamped --;

Signed and Sealed this

Thirtieth Day of April, 2002

Attest:

Attesting Officer

JAMES E. ROGAN  
Director of the United States Patent and Trademark Office